| (12) | United States Patent | (10) Patent No.: | US 10,748,816 B2 |
|---|---|---|---|
| | Zhou | (45) Date of Patent: | Aug. 18, 2020 |

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/680,406

(22) Filed: Aug. 18, 2017

(65) Prior Publication Data

US 2018/0061716 A1    Mar. 1, 2018

(30) Foreign Application Priority Data

Aug. 26, 2016    (CN) .......................... 2016 1 0738862

(51) Int. Cl.
*H01L 27/092*    (2006.01)
*H01L 21/8234*    (2006.01)
(Continued)

(52) U.S. Cl.
CPC ............. *H01L 21/823481* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS

| 6,287,912 B1 * | 9/2001 | Asakura ............ H01L 21/82385 |
| | | 257/E21.639 |
| 2005/0019993 A1 | 1/2005 | Lee et al. |
| | | (Continued) |

FOREIGN PATENT DOCUMENTS

| CN | 101807602 A | 8/2010 |
| CN | 102655092 A | 9/2012 |

OTHER PUBLICATIONS

The European Patent Office (EPO) The Extended European Search Report for 17186343.4 dated Jan. 22, 2018 8 Pages.

*Primary Examiner* — Joseph C. Nicely
*Assistant Examiner* — Lamont B Koo
(74) *Attorney, Agent, or Firm* — Anova Law Group, PLLC (57) ABSTRACT

Semiconductor devices and fabrication methods thereof are provided. An exemplary fabrication method includes providing a base substrate; forming an isolation layer in the base substrate; forming dummy gate structures on the base substrate at two sides of the isolation layer; forming an additional gate structure on the isolation layer and a first protective layer on surfaces of the additional gate structure and the dummy gate structures; forming an interlayer dielectric layer covering side surfaces of the dummy gate structures, the additional gate structure and the first protective layer over the base substrate; removing a portion of the first protective layer over the additional gate structure; forming a second protective layer on the additional gate structure; removing portions of the first protective layer over the dummy gate structures using the second protective layer as a mask; and removing the dummy gate structures to form openings in the interlayer dielectric layer.

14 Claims, 5 Drawing Sheets

(51) Int. Cl.
*H01L 27/088* (2006.01)
*H01L 29/06* (2006.01)
*H01L 29/08* (2006.01)
*H01L 29/66* (2006.01)
*H01L 29/51* (2006.01)

(52) U.S. Cl.
CPC .. *H01L 21/823468* (2013.01); *H01L 27/0886* (2013.01); *H01L 29/0653* (2013.01); *H01L 29/0847* (2013.01); *H01L 29/66545* (2013.01); *H01L 29/517* (2013.01)

(56) References Cited

U.S. PATENT DOCUMENTS

| | | |
|---|---|---|
| 2011/0266633 A1 | 11/2011 | Beyer et al. |
| 2013/0102138 A1 | 4/2013 | Yeh et al. |
| 2016/0099181 A1 | 4/2016 | Tung |
| 2016/0190271 A1* | 6/2016 | You ................... H01L 29/42376 257/401 |
| 2016/0225762 A1 | 8/2016 | Zang et al. |

* cited by examiner

SEMICONDUCTOR DEVICE AND FABRICATION METHOD THEREOF

CROSS-REFERENCES TO RELATED APPLICATIONS

This application claims the priority of Chinese patent application No. 201610738862.3, filed on Aug. 26, 2016, the entirety of which is incorporated herein by reference.

FIELD OF THE DISCLOSURE

The present invention generally relates to the field of semiconductor manufacturing and, more particularly, relates to semiconductor devices and fabrication methods thereof.

BACKGROUND

Metal-oxide-semiconductor (MOS) transistors are the most important devices in modern integrated circuits (ICs). The basic structure of a MOS transistor includes a substrate, a gate structure formed on the semiconductor substrate, and a doped source region and a doped drain region formed in the semiconductor substrate at two sides of the gate structure. The gate structure includes a gate dielectric layer formed on the semiconductor substrate and a gate electrode layer formed on the gate dielectric layer.

With the continuous development of the semiconductor technologies, the control ability of the gate structure of the conventional planar MOS transistor has been reduced; and a severe leakage current issue occurs. Fin field-effect transistors (FinFETs) are a new type of multiple-gate devices. A typical FinFET transistor includes a semiconductor substrate, a plurality of fins protruding from the surface of the semiconductor substrate, a gate structure covering portions of the side and top surfaces of the fins formed on the surface of the semiconductor substrate; and doped source regions and doped drain regions formed in the fins at two sides of the gate structure.

However, when forming semiconductor devices having MOS transistors and/or FinFETs, it is difficult to avoid consuming the isolation layer and to lower process difficulties simultaneously. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor device. The fabrication method includes providing a base substrate; forming an isolation layer in the base substrate; forming dummy gate structures on the base substrate at two sides of the isolation layer; forming an additional gate structure on the isolation layer and a first protective layer on surfaces of the additional gate structure and the dummy gate structures; forming an interlayer dielectric layer covering side surfaces of the dummy gate structures, the additional gate structure and the first protective layer over the base substrate; removing a portion of the first protective layer over the additional gate structure; forming a second protective layer on a top surface of the additional gate structure; removing portions of the first protective layer over the dummy gate structures using the second protective layer as a mask; and removing the dummy gate structures to form openings in the interlayer dielectric layer.

Another aspect of the present disclosure includes a semiconductor device. The semiconductor device includes a base substrate; an isolation layer formed in the base substrate; gate structures formed on the base substrate at two sides of additional gate structure; an additional gate structure formed on the isolation layer; doped source/drain regions formed in the base substrate at two sides of the gate structures; an interlayer dielectric layer formed over the base substrate and covering the side surfaces of the gate structures and the additional gate structure; and a protective layer formed on the additional gate structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
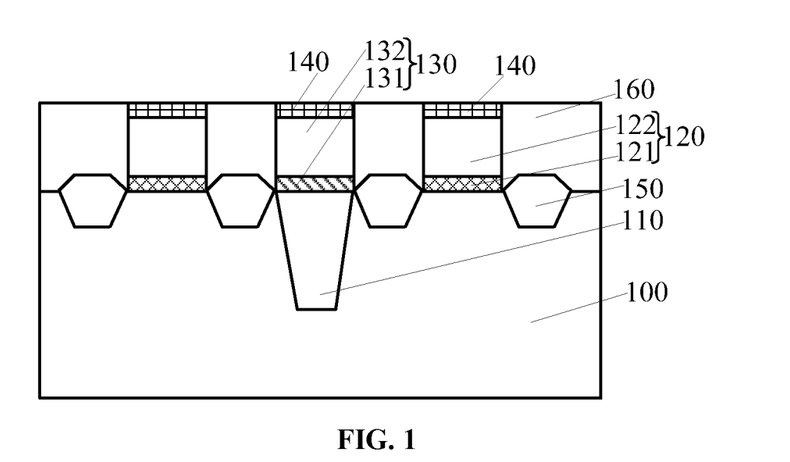
FIGS. 1-3 illustrate semiconductor structures corresponding to certain stages of a fabrication process of a semiconductor device.
Figure 2:
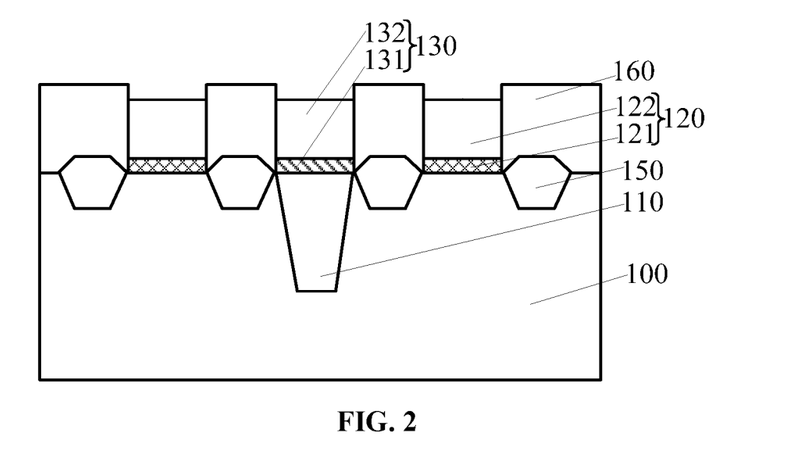
Figure 3:
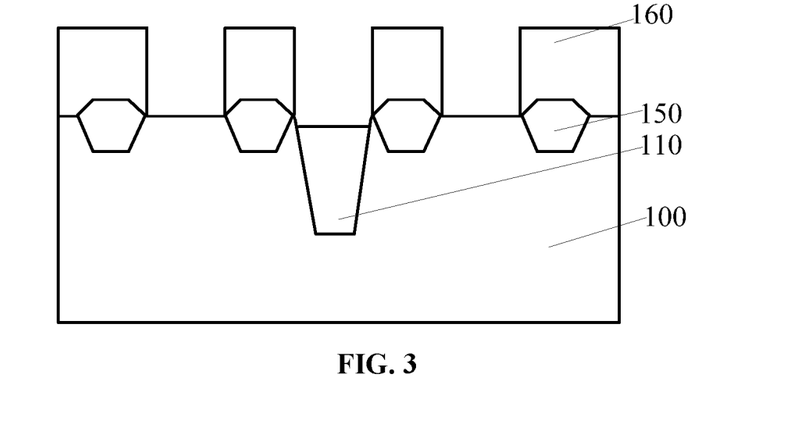

FIGS. 1-3 illustrate semiconductor structures corresponding to certain stages of a fabrication method of a semiconductor device. As shown in FIG. 1, the fabrication method includes providing a semiconductor substrate 100 having an isolation layer 110; forming dummy gate structures 120 on the semiconductor substrate 100 at two sides of the isolation layer 110; and forming an additional gate structure 130 on the isolation layer 110. The top surfaces of the dummy gate structures 120 and the surface of the additional gate structure 130 have a mask layer 140. Further, the method includes forming raised doped source/drain regions 150 in the semiconductor substrate 100 at two sides of the dummy gate structures 120; and forming an interlayer dielectric layer 160 over the semiconductor substrate 100. The interlayer dielectric layer 160 covers the side surfaces of the dummy gate structures 120, the additional gate structure 130 and the mask layer 140.

The dummy gate structures 120 include the dummy gate dielectric layer 121 on the surface of the substrate 100 at two sides of the insolation layer 110; and a dummy gate electrode layer 122 formed on the dummy gate dielectric layer 121. The additional gate structure 130 includes an additional gate dielectric layer 131 and an additional gate electrode layer 132 formed on the additional gate dielectric layer 131. The dummy gate dielectric layer 121, the additional gate dielectric layer 131 and the isolation layer 110 are often made of silicon oxide. The dummy gate electrode layer 122 and the additional gate electrode layer 132 are often made of polysilicon.

The additional gate structure 130 and the dummy gate structures 120 may together be used to limit the growth spaces of the raised source/drain regions 150.

Further, as shown in FIG. 2, after forming the interlayer dielectric layer 160, the portions of the mask layer 140 on the top surfaces of the dummy gate structures 120 (referring to FIG. 1) are removed by a mask-less etching process.

Further, as shown in FIG. 3, after removing the portions of the mask layer 140 on the top surfaces of the dummy gate structures 120, the dummy gate structures 120 and the additional gate structure 120 are removed. A plurality of the openings (not labeled) are formed in the dielectric layer 160.

After forming the plurality of openings, a high-K gate dielectric layer is formed on the side and bottom surfaces of the openings. Then, a metal gate electrode layer is formed on the high-K gate dielectric layer.

However, during the process for forming such a semiconductor device, the isolation layer 110 is often consumed. The portion of the mask layer 140 on the top surface of the additional gate structure 130 is exposed in the mask-less etching process. Thus, the process for removing the portions of the mask layer 140 on the dummy gate structures 120 also removes the portion of the mask layer 140 on the additional gate structure 130. Thus, the top surfaces of the dummy gate structures 120 and the additional gate structure 130 are exposed. Further, the process for removing the dummy gate electrode layer 122 also removes the additional gate electrode layer 132; and the process for removing the dummy gate dielectric layer 121 also removes the additional gate dielectric layer 131. Because the additional gate dielectric layer 131 and the isolation layer 110 are made of a same material, the process for removing the additional gate dielectric layer 131 also etches the isolation layer 110. Thus, the semiconductor substrate 100 covered by the isolation layer 110 may be exposed.

For the convenient purposes, the region formed by removing the additional gate structure 130 is referred to as an additional opening. The region formed by consuming the isolation layer 110 is referred to as an isolation opening.

During the process for forming the high-K gate dielectric layer in the openings, the material of the high-K gate dielectric layer is also formed in the additional opening and the isolation opening. During the process for forming the metal gate electrode layer, the material of the metal gate electrode layer is also formed in the additional opening and the isolation opening. Because the isolation opening locates at the bottom of the additional opening, the high-K gate dielectric layer may not be easy to fill the isolation opening, partial regions of the inner surfaces of the isolation opening may not have the material of the high-K gate dielectric layer. Thus, the material of the metal gate electrode layer may be easy to contact with the portions of the semiconductor substrate exposed by the isolation opening; and a short-circuit issue may occur.

To avoid the consumption of the isolation structure 110, an etching process with a mask may be used to remove the mask layer 140 on the top surfaces of the dummy gate structures 120 so as to keep the portion of the mask layer 140 on the top surface of the additional gate structure 130. However, the surface area of the isolation layer 110 is relatively small. Correspondingly, the top surface area of the additional gate structure 130 is also relatively small. Thus, it needs to form a mask layer having a relatively small area on the top surface of the additional gate structure 130. Accordingly, the height-to-width ratio of the mask layer is increased; and the mask layer is easy to clasp. Thus, the process difficulties may be increased.

The present disclosure provides a semiconductor device and a fabrication method thereof. The method may include providing a base substrate having an isolation layer; forming dummy gate structures on the substrate at two sides of the isolation layer; and forming an additional gate structure on the isolation layer. A first protective layer may be formed on the surfaces of the additional gate structure and the dummy gate structures. The method may also include forming an interlayer dielectric layer over the base substrate to cover the side surfaces of the dummy gate structures, the additional gate structure and the first protective layer; removing a portion of the first protective layer over the additional gate structure; forming a second protective layer on the top surface of the additional gate structure; removing portions of the first protective layer over the dummy gate structures using the second protective layer as a mask; and removing the dummy gate structures to form openings in the dielectric layer.

During the process for removing the from portions of the first protective layer from the top surfaces of the dummy gate structures, the second protective layer may be used as a mask. Thus, after removing the second portions of the first protective layer from the top surfaces of the dummy gate structures, there is at least a portion of the second protective layer (i.e., remaining protective layer) may be left on the top surface of the additional gate structure. During the process for removing the dummy gate structures, because the portion of the second protective layer may be still on the top surface of the additional gate structure, the portion of the second protective layer may be able to prevent the additional gate structure from being etched and removed. Thus, the isolation layer may not be consumed during the process for removing the dummy gate structures.

Further, in the present disclosed methods, the portion of the first protective layer on the top surface of the additional gate structure may be removed firstly, then the second protective layer may be formed on the top surface of the additional gate structure to prevent the consumption of the isolation layer, it may not need to form an extra mask layer on the region having the additional gate structure. Thus, the process difficulties may be reduced.

Figure 10:
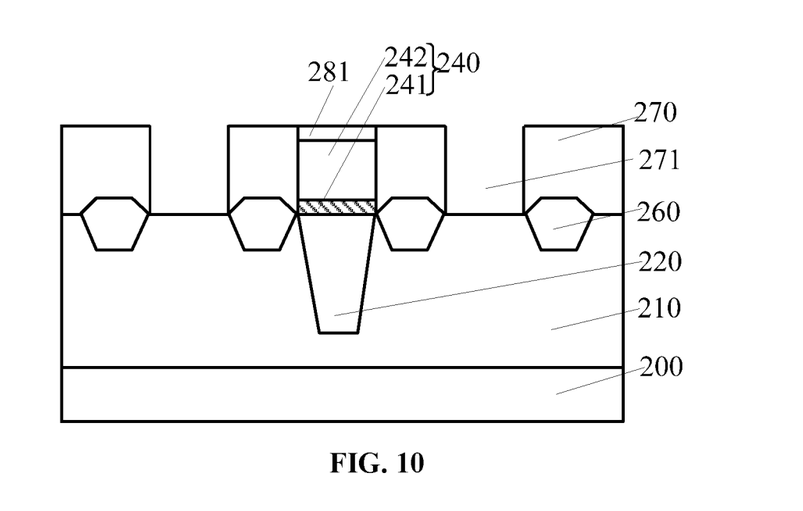
Figure 11:
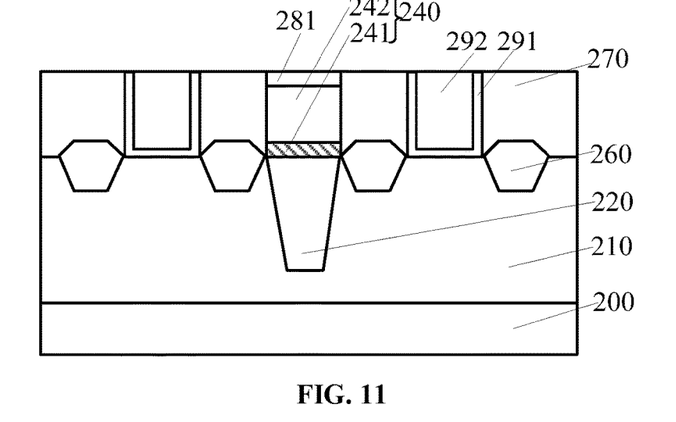
Figure 12:
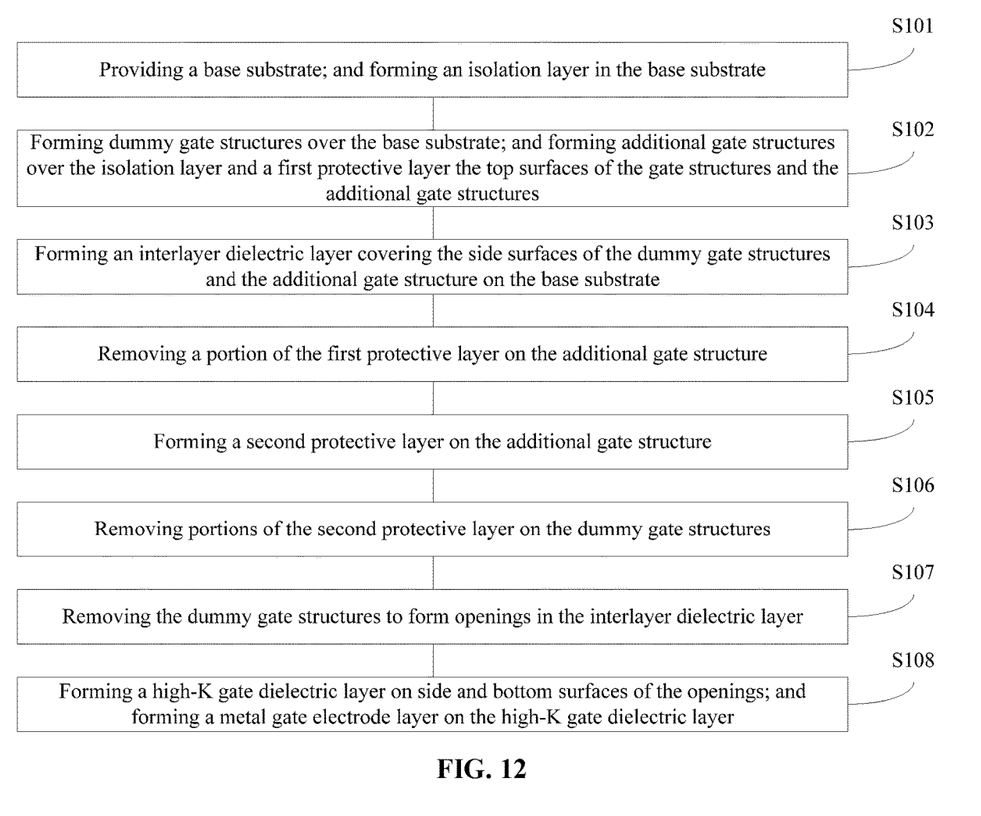
FIG. 12 illustrates an exemplary fabrication process of a semiconductor device consistent with the disclosed embodiments.

FIG. 12 illustrates an exemplary fabrication process of a semiconductor device consistent with the disclosed embodiments. FIGS. 4-11 illustrate semiconductor structures corresponding to certain stages of the exemplary fabrication process. For illustrative purposes, a FinFET structure is described herein. In some embodiments, the semiconductor device may be a planar MOS transistor structure.

Figure 4:
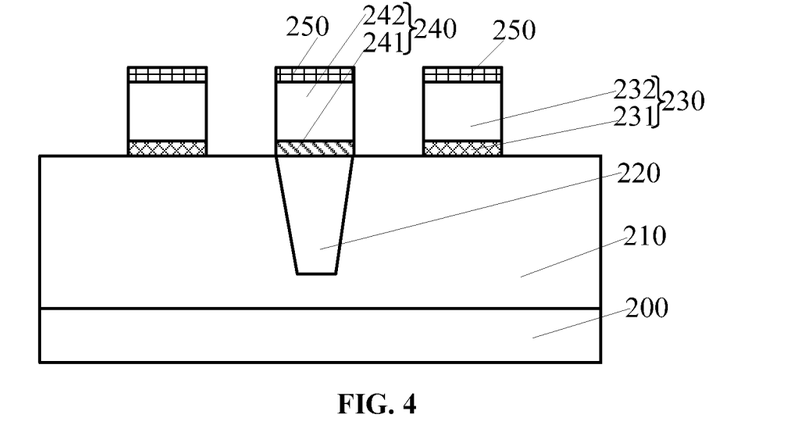
FIGS. 4-11 illustrate semiconductor structures corresponding to certain stages of an exemplary fabrication process of a semiconductor device consistent with the disclosed embodiments.

As shown in FIG. 12, at the beginning of the fabrication process, a base substrate with certain structures is provided (S101). FIG. 4 illustrates a corresponding semiconductor structure.

As shown in FIG. 4, a base substrate is provided. An isolation layer 220 may be formed in the base substrate.

In one embodiment, the base substrate may include a semiconductor substrate 200 and a plurality of fins 210 formed on the semiconductor substrate 200 and protruding from the semiconductor substrate 200. In some embodiments, when the semiconductor device is a planar MOS transistor, the base substrate may be a planar semiconductor substrate. The semiconductor substrate 200 provides a process platform for forming the semiconductor device.

The semiconductor substrate 200 may be made of any appropriate material, such as single crystal silicon, polycrystal silicon, amorphous silicon, germanium, silicon germanium, or gallium arsenide, etc. In one embodiment, the semiconductor substrate 200 is made of single crystal silicon.

In one embodiment, the plurality of fins 210 may be formed by etching the semiconductor substrate 200. In some embodiments, the plurality of fins 210 may be formed by forming a fin material layer on the semiconductor substrate 200; and patterning the fin material layer to form the plurality of fins 210 on the semiconductor substrate 200.

The isolation layer 220 may be used to isolate the adjacent active regions. In one embodiment, the process for forming the isolation layer 220 may include forming an initial isolation layer to cover the side surfaces of the plurality of fins 210; and forming a first mask layer on the initial isolation layer. The first mask layer may have a trench. The first mask layer may define the position of the isolation layer 220. The length direction of the trench may be perpendicular to the length direction of the fins 210; and may be parallel to the surface of the semiconductor substrate 200. After forming the first mask layer, an anisotropic dry etching process may be used to etch the initial isolation layer and the fins 210 to form a bottom trench (not shown) in the initial isolation layer and the fins 210. Then, an intermediate isolation layer may be formed in the trench and the bottom trench. After forming the intermediate isolation layer, the first mask layer may be removed. Then, an etch-back process may be performed on the intermediate isolation layer and the initial isolation layer between adjacent fins 210 to cause the top surface of the initial isolation layer between the adjacent fins 210 to be below the top surfaces of the fins 210. After the etch-back process, the top surface of the intermediate layer may be coplanar, or above the top surfaces of the fins 210.

The initial isolation layer between adjacent fins 210 and with the top surface below the top surfaces of the fins 210 may form isolation structures. The intermediate layer after the etch-back process may form the isolation layer 220.

The isolation layer 220 and the isolation structures may be made of any appropriate material, such as silicon oxide, silicon oxynitride, or silicon carbonoxide, etc.

In one embodiment, the top surface of the isolation layer 220 levels with the top surfaces of the fins 210. In some embodiments, the top surface of the isolation layer may be above the top surfaces of the fins.

Returning to FIG. 12, after forming the isolation layer 220, dummy gate structures and additional gate structures may be formed (S102). FIG. 4 illustrates a corresponding semiconductor structure.

As shown in FIG. 4, dummy gate structures 230 are formed on the base substrate at two sides of the isolation layer 220. Additional gate structures 240 are formed on the isolation layer 220. A first protective layer 250 may be formed on the top surfaces of the additional gate structures 240 and the top surfaces of the dummy gate structures 230. For illustrative purposes, two dummy gate structures 230 and one additional structure 240 are shown herein.

In one embodiment, the dummy gate structures 230 may be across the plurality of fins 210; and may cover the side and top surfaces of the fins 210.

The dummy gate structures 230 may include a dummy gate dielectric layer 231 across the fins 210 and a dummy gate electrode layer 232 formed on the dummy gate dielectric layer 231. The dummy gate dielectric layer 231 may be on the surface of the isolation structure; and may cover portions of the top and side surfaces of the fins 210.

The dummy gate dielectric layer 231 may be made of any appropriate material. In one embodiment, the dummy gate dielectric layer 231 is made of silicon oxide.

The dummy gate electrode layer 232 may be made of any appropriate material. In one embodiment, the dummy gate electrode layer 232 is made of polysilicon.

The additional gate structure 240 may include an additional gate dielectric layer 241 formed on the isolation layer 220 and an additional gate electrode layer 242 formed on the additional gate dielectric layer 241.

The additional gate dielectric layer 241 may be made of any appropriate material. In one embodiment, the additional gate dielectric layer 241 is made of silicon oxide.

The additional gate electrode layer 242 may be made of any appropriate material. In one embodiment, the additional gate electrode layer 242 is made of polysilicon.

The first protective layer 250 may be made of any appropriate material, such as silicon nitride, or silicon carbonitride, etc.

The process for forming the dummy gate structures 230, the additional gate structure 240 and the first protective layer 250 may include forming an initial gate structure layer (not labeled) over the base substrate. The initial gate structure layer may include an initial gate dielectric material layer over the base substrate; and an initial gate electrode material layer on the initial gate dielectric material layer. After forming the initial gate structure layer, a first protective material layer may be formed on the initial gate structure layer. Then, the first protective material layer and the initial gate structure layer may be patterned to form the dummy gate structures 230, the additional gate structures 240 and the first protective layer 250.

In one embodiment, specifically, the initial gate structure layer may cover the semiconductor substrate 200 and the fins 210. The dummy gate dielectric layer 231 and the additional gate dielectric layer 241 may correspond to the initial gate dielectric material layer. The gate electrode layer 232 and the additional gate electrode layer 242 may correspond to the initial gate electrode material layer. The first protective layer 250 may correspond to the first protective material layer.

The additional gate structure 240 and the dummy gate structures 230 may together be used to limit the growth spaces of the subsequently formed doped source/drain regions.

Figure 5:
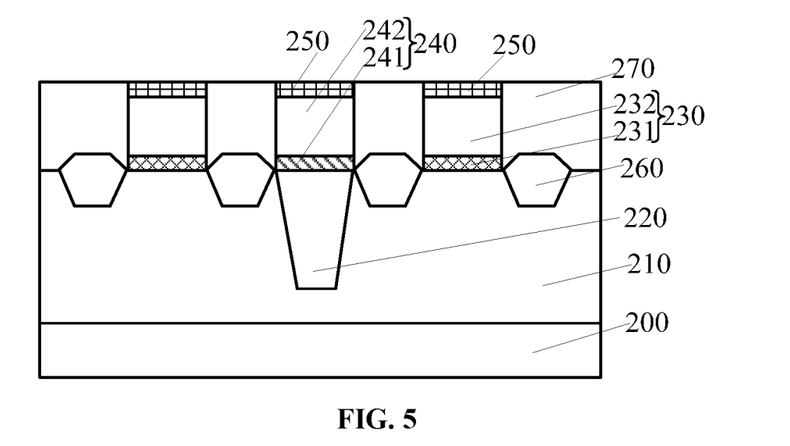

Returning to FIG. 12, after forming the additional gate structure 240 and the dummy gate structures 230, and the first protective layer 250, an interlayer dielectric layer may be formed (S103). FIG. 5 illustrates a corresponding semiconductor structure.

As shown in FIG. 5, an interlayer dielectric layer 270 is formed over the base substrate. The interlayer dielectric layer 270 may cover the side surfaces of the dummy gate structures 230, the additional gate structure 240 and the first protective layer 250. Further, the interlayer dielectric layer 270 may expose the top surface of the first protective layer 250.

The interlayer dielectric layer 270 may be made of any appropriate material, such as silicon oxide, silicon oxycarbide, or silicon oxynitride, etc. The material of the interlayer dielectric layer 270 may be different from the material of the first protective layer 250.

In one embodiment, before forming the interlayer dielectric layer 270, first sidewall spacers (not shown) may be formed on the side surfaces of the dummy gate structures 230; and second sidewall spacers (not shown) may be formed on the side surfaces of the additional gate structures 240. After forming the first sidewall spacers and the second sidewall spacers, doped source/drain regions 260 may be formed in the fins 210 at two sides of the first sidewall spacers and the dummy gate structures 230. Then, the interlayer dielectric layer 270 covering the side surfaces of the dummy gate structures 230, the additional gate structure 240 and the first protective layer 250 may be formed on the base substrate. The interlayer dielectric layer 270 may also cover the sides surfaces of the first sidewall spacers and the second sidewall spacers, and the doped source/drain regions 260.

The first sidewall spacers and the second sidewall spacers may be made of any appropriate material(s), such as silicon nitride, silicon oxynitride, or silicon oxycarbide, etc. The interlayer dielectric layer 270 may be made of any appropriate material, such as silicon oxide, silicon oxynitride, or silicon oxycarbide, etc. The first sidewall spacers and the second sidewall spacers may be made of a material different from the interlayer dielectric layer 270.

The process for forming the doped source/drain regions 260 may include forming trenches in the fins 210 at two sides of each of the dummy gate structures 230 and the first sidewall spacers. The side surfaces of the trenches may expose the fins 210. Then, a source/drain material layer may be formed in the trenches by an epitaxial growth process; and the doped source/drain regions 260 may be formed.

The portions of the first protective layer 250 on the top surfaces of the first sidewall spacers and the dummy gate structures 230 may be able to prevent the material of the doped source/drain regions 260 from growing on the top surfaces of the dummy gate structures 230. The portions of the first protective layer 250 on the top surfaces of the second sidewall spacers and the additional gate structure 240 may be able to prevent the material of the doped source/drain region 260 from growing on the top surface of the additional gate structure 240.

In one embodiment, the doped source/drain regions 260 may protrude from the surface of the base substrate. Specifically, the doped source/drain regions 260 may protrude from the top surfaces of the fins 210.

In one embodiment, because the additional gate structure 240 is formed on the isolation layer 220, the additional gate structure 240 may be able to limit the growth space of the doped source/drain regions 260. Thus, for the doped source/drain regions 260 between the dummy gate structures 230 and the additional gate structure 240, the morphology of the doped source/drain region 260 adjacent to the dummy gate structures 230 and the morphology of the doped source/drain regions 260 adjacent to the additional gate structure 240 may be symmetrical.

In some embodiments, the surfaces of the doped source/drain regions may level with the surface of the base substrate.

Figure 6:
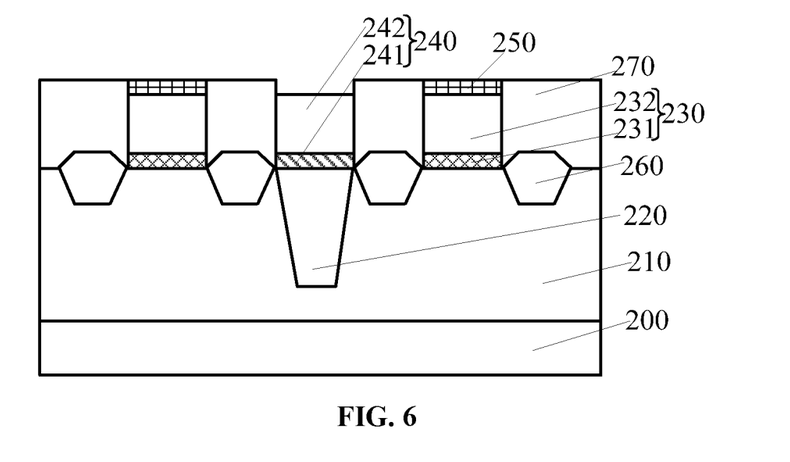

Returning to FIG. 12, after forming the interlayer dielectric layer 270, a portion of the first protective layer 250 over the additional gate structure 240 may be removed (S104). FIG. 6 illustrates a corresponding semiconductor structure.

As shown in FIG. 6, the portion of the first protective layer 250 over the additional gate structure 240 is removed. After removing the portion of the first protective layer 250 over the additional gate structure 240, the top surface of the additional gate structure 240 may be exposed.

The process for removing the portion of the first protective layer 250 over the additional gate structure 240 may include forming a second mask layer (not shown) on the interlayer dielectric layer 270 and the portions of the first protective layer 250 over the surfaces of the dummy gate structures 230. The second mask layer may expose the portions of the first protective layer 250 on the additional gate structures 240. Then, the portions of the first protective layer 250 on the additional gate structures 240 may be removed using the second mask layer as a mask.

Because the area of the portions of the first protective layer 250 on the top surfaces of the dummy gate structures 230 may be greater than the area of the portion of the first protective layer 250 on the additional gate structure 240, the area of the second mask layer may be relatively large. Correspondingly, the height-to-width ratio of the second mask layer may be relatively small. Thus, the collapse of the second mask layer may be avoided; and the process difficulties may be reduced.

Figure 7:
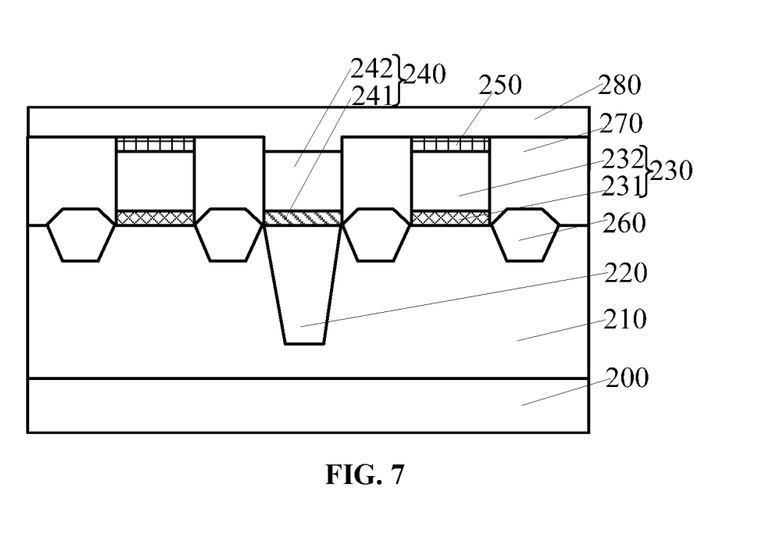
Figure 8:
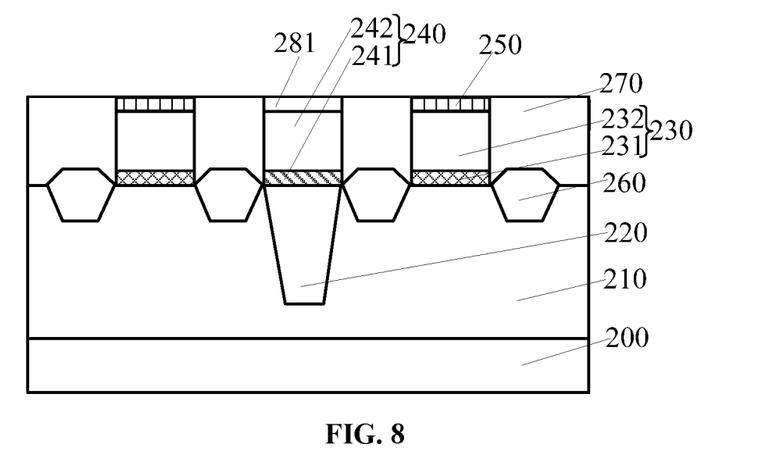

Returning to FIG. 12, after removing the portion of the first protective layer 250 over the additional gate structure 240, a second protective layer may be formed (S105). FIGS. 7-8 illustrate corresponding semiconductor structures.

As shown in FIG. 7, a second protective material layer 280 is formed on the interlayer dielectric layer 270, the first protective layer 250 and the additional gate structure 240. Then, as shown in FIG. 8, the portion of the second protective material layer 280 above the interlayer dielectric layer 270 and the first protective layer 250 may be removed. Thus, The second protective layer 281 may be formed on the additional gate structure 240.

The second protective material layer 280 may be formed by a deposition process, such as a plasma-enhanced chemical vapor deposition (PECVD) process, a sub-atmosphere chemical vapor deposition (SACVD) process, or a low pressure chemical vapor deposition (LPCVD) process, etc.

The second protective layer 281 may be made of any appropriate material, such as silicon oxide, silicon oxynitride, or silicon oxycarbide, etc. The material of the second protective layer 281 may be different from the material of the first protective layer 250 such that the second protective layer 281 and the first protective layer 250 may have different etching rates during the subsequent etching process for removing the portions of the first protective layer 250 on the top surfaces of the dummy gate structures 230.

The portion of the second protective material layer 280 above the interlayer dielectric layer 270 and the first protective layer 250 may be removed by any appropriate process, such as a planarization process, etc. The planarization process may include a chemical mechanical polishing process, or a physical mechanical polishing process, etc.

Figure 9:
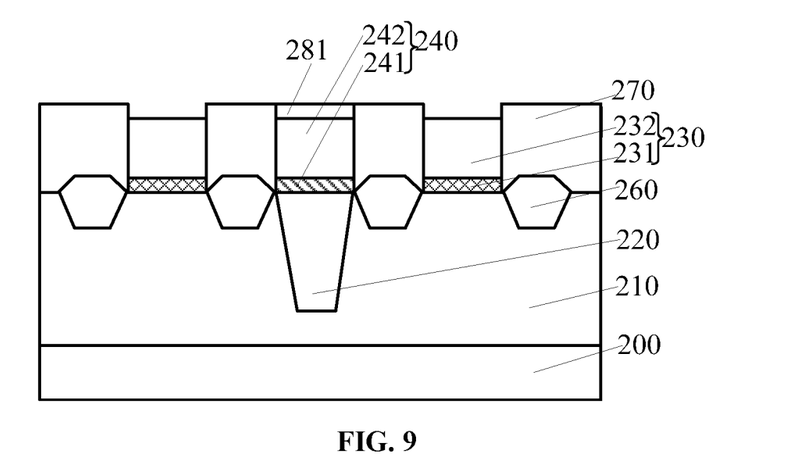

Returning to FIG. 12, after forming the second protective layer 281, the portions of the first protective layer 250 on the dummy gate structures 230 may be removed (S106). FIG. 9 illustrates a corresponding semiconductor structure.

As shown in FIG. 9, the portions of the first protective layer 250 on the dummy gate structures 230 are removed. The portions of the first protective layer 250 on the dummy gate structures 230 may be removed by an etching process using the second protective layer 281 as an etching mask.

During the process for removing the portions of the first protective layer 250 on the dummy gate structures 230, the second protective layer 281 may be used as a mask. After removing the portions of the first protective layer 250 on the dummy gate structures 230, at least a portion of the second protective layer 281 on the additional gate structure 240 may be left on the top surface of the additional gate structure 240. Such a left portion of the second protective layer 281 may be referred to as a remaining protective layer 281.

Specifically, during the process for removing the portions of the first protective layer 250 on the dummy gate structures 230 by the etching process using the second protective layer 281 as a mask, the etching rate to the first protective layer 250 may be greater than the etching rate to the second protective layer 281.

In one embodiment, during the process for removing the portions of the first protective layer 250 on the dummy gate structures 230, the etching rate ratio between the first protective layer 250 and the second protective layer 281 may be in a range of approximately 5-200, such as 10, 20, 50, 100, or 150, etc. If the etching rate ratio between the first protective layer 250 and the second protective layer 281 is greater than 200 during the process for removing the portions of the first protective layer 250 on the dummy gate structures 230, the difficulties to realize the etching process may be increased. If the etching rate ratio between the first protective layer 250 and the second protective layer 281 is smaller than 5 during the process for removing the portions of the first protective layer 250 on the dummy gate structures 230, the protection effect of the remaining protective layer 281 to the additional gate structure 240 may be reduced.

The process for removing the portions of the first protective layer 250 on the dummy gate structures 230 may be a dry etching process, or a wet etching process. In one embodiment, the portions of the first protective layer 250 on the dummy gate structures 230 are removed by an anisotropic dry etching process. The etching gases of the dry etching process may include $N_2$ and $O_2$, etc. The flow rate of $N_2$ may be in range of approximately 20 sccm-500 sccm. The flow rate of $O_2$ may be in a range of approximately 3 sccm-50 sccm. The radio frequency power may be in range of approximately 30 W-300 W. The bias voltage may be in a range of approximately 10 V-150 V. The chamber pressure may be in a range of approximately 2 mTorr-500 mTorr.

Returning to FIG. 12, after removing the portions of the first protective layer 250 on the dummy gate structures 230, the dummy gate structures 230 may be removed (S107). FIG. 10 illustrates a corresponding semiconductor structure.

As shown in FIG. 10, the dummy gate structures 230 (referring to FIG. 9) are removed; and the openings 271 are formed in the interlayer dielectric layer. The dummy gate structures 230 may be removed by removing the dummy gate electrode layer 232; and removing the dummy gate dielectric layer 231.

During the process for removing the dummy gate structures 230, the remaining protective layer 281 may be still on the additional gate structure 240. Thus, the remaining protective layer 281 may be able to prevent the additional gate structure 240 from being removed. Thus, the isolation layer 220 may not be consumed.

Returning to FIG. 12, after removing the dummy gate structures 230 to form the openings 271, a high-K gate dielectric layer and a metal gate electrode layer may be formed (S108). FIG. 11 illustrates a corresponding semiconductor structure.

As shown in FIG. 11, a high-K (K>3.9) gate dielectric layer 291 is formed on the side and bottom surfaces of the openings 271; and a metal gate electrode layer 292 may be formed on the high-K gate dielectric layer 291. The high-K gate dielectric layer 291 and the metal gate electrode layer 292 may form a plurality of gate structures (not labeled) between two adjacent doped source/drain regions 260.

The high-K gate dielectric layer 291 may be made of any appropriate material, such as $HfO_2$, $La_2O_3$, HfSiON, $HfAlO_2$, $ZrO_2$, $Al_2O_3$, or $HfSiO_4$, etc. The metal gate electrode layer 292 may be made of any appropriate material, such as Al, Cu, Ag, Au, Ni, Ti, W, WN, or WSi, etc.

The process for forming the high-K gate dielectric layer 291 and the metal gate electrode layer 292 may include forming a high-K dielectric material layer (not labeled) on the side and bottom surfaces of the openings 271 and the top surface of the interlayer dielectric layer 270; forming a metal gate electrode material layer (not shown) on the high-K gate dielectric layer; removing the metal gate electrode material layer and the high-K gate dielectric layer above the interlayer dielectric layer 270. Thus, the high gate dielectric layer 291 and the metal gate electrode layer 292 may be formed. The high-K gate dielectric layer 291 may correspond to the high-K dielectric material layer; and the metal gate electrode layer 292 may correspond to the metal gate electrode material layer.

The high-K gate dielectric material layer and the metal gate electrode material layer may be formed by a deposition process, such as a PECVD process, an ALD process, an LPCVD process, or an SACVD process, etc.

In one embodiment, the first sidewall spacers (not shown) may be formed on the side surfaces of the dummy gate structures 230. Thus, the high-K dielectric layer may be formed on the side surfaces of the first sidewall spacers.

Because the isolation layer 220 may not be consumed by the etching process, during process for forming the high-K gate dielectric material layer, the material of the high-K gate dielectric material layer may not contact with the fins 210 covered by the isolation layer 220. Correspondingly, during the process for forming the metal gate material layer, the material of the metal gate material layer may also not contact with the fins 210 covered by the isolation layer 220. Thus, a short-circuit issue may be avoided.

Thus, a semiconductor device may be formed by the disclosed methods and processes. FIG. 11 illustrates a corresponding semiconductor device. For illustrative purposes, the semiconductor device is a FinFET device. In some embodiments, the semiconductor device may be a planar semiconductor device.

As shown in FIG. 11, the semiconductor device may include a semiconductor substrate 200 and a plurality of fins 210 protruding from the semiconductor substrate 200. The semiconductor device may also include an isolation layer 210 formed in the fins 210; and an additional gate structure 240 formed on the isolation layer 210. The additional gate structure 210 may include an additional gate dielectric layer 241 formed on the isolation layer 210; and an additional gate electrode layer 242 formed on the additional gate dielectric layer 241. Further, the semiconductor device may also include gate structures across the fins 210; and doped source/drain regions 260 formed in the fins 210 at two sides of the gate structures. The gate structures may include a gate dielectric layer 291 and a metal gate electrode layer 292 formed on the metal gate electrode layer 292. Further, the semiconductor device may also include an interlayer dielectric layer 270 formed over the semiconductor substrate 200 and covering the side surfaces of the gate structures and the additional gate structure 240; and a remaining protective layer 281 formed on the additional gate structure 240. The detailed structures and intermediate structures are described above with respect to the fabrication processes.

Thus, according to the disclosed embodiments, during the process for removing the portions of the first protective layer on the dummy gate structures, the second protective layer may be used as a mask. Thus, after removing the portions of the first protective layer on the dummy gate structures, there is at least a portion of the second protective layer left on the top surface of the additional gate structure. During the process for removing the dummy gate structures, because the portion of the second protective layer may be still on the top surface of the additional gate structure. The portion of the second protective layer may be able to prevent the additional gate structure from being etched and removed. Thus, the isolation layer may not be consumed during the process for removing the dummy gate structures.

Further, in the present disclosed methods, the portion of the first protective layer on the top surface of the additional gate structure may be removed firstly, then the second protective layer may be formed on the top surface of the additional gate structure to prevent the consumption of the isolation layer, it may not need to form an extra mask layer on the region having the additional gate structure. Thus, the process difficulties may be reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
   providing a base substrate;
   forming an isolation layer in the base substrate;
   forming dummy gate structures on the base substrate at two sides of the isolation layer;
   forming an additional gate structure on the isolation layer and a first protective layer on surfaces of the additional gate structure and the dummy gate structures;
   forming an interlayer dielectric layer covering side surfaces of the dummy gate structures, the additional gate structure and the first protective layer over the base substrate;
   removing a portion of the first protective layer over the additional gate structure while keeping remaining portion of the first protective layer over the dummy gate structures;
   forming a second protective layer on a top surface of the additional gate structure after removing the portion of the first protective layer over the additional gate structure, wherein an etching rate of the second protective layer is smaller than an etching rate of the first protective layer;
   removing the remaining portions of the first protective layer over the dummy gate structures using the second protective layer as a mask; and
   removing the dummy gate structures to form openings in the interlayer dielectric layer.

2. The method according to claim 1, further including:
   selecting materials for a first conductive layer and the second protective layer, such that: when removing the second portions of the first protective layer using the second protective layer as the mask, the first protective layer has an etching rate greater than the second protective layer.

3. The method according to claim 2, wherein:
   an etching rate ratio between the etching rate of the first protective layer over the etching rate of the second protective layer is in range of approximately 5-200.

4. The method according to claim 2, wherein:
   the first protective layer is made of one of silicon nitride and silicon carbonitride; and the second protective layer is made of one of silicon oxide, silicon oxynitride and silicon oxycarbide.

5. The method according to claim 1, wherein forming the second protective layer comprises:
   forming a second protective material layer on top surfaces of the interlayer dielectric layer, the first protective layer and the additional gate structure; and
   removing a portion of the second protective material layer above the top surfaces of the interlayer dielectric layer and the first protective layer.

6. The method according to claim 1, wherein the dummy gate structure comprises:
   a dummy gate dielectric layer formed on the base substrate at two sides of the isolation layer; and
   a dummy gate electrode layer formed on the dummy gate dielectric layer.

7. The method according to claim 6, wherein:
   the dummy gate dielectric layer is made of silicon oxide; and
   the dummy gate electrode layer is made of polysilicon.

8. The method according to claim 7, wherein removing the dummy gate structures comprises:
   removing the dummy gate electrode layer; and
   removing the dummy gate dielectric layer.

9. The method according to claim 1, wherein forming the dummy gate structures, the additional dummy gate structure and the first protective layer comprises:
   forming an initial gate structure layer on the base substrate;
   forming a first protective material layer on the initial gate structure layer; and
   patterning the first protective material layer and the initial gate structure layer to form the dummy gate structures, the additional gate structure and the first protective layer.

10. The method according to claim 1, before forming the interlayer dielectric layer, further comprising:
    forming first sidewall spacers on side surfaces of the dummy gate structures;
    forming second sidewall spacers on side surfaces of the additional gate structure; and
    forming doped source/drain regions in the base substrate at two sides of the dummy gate structures.

11. The method according to claim 1, after removing the dummy gate structures to form the openings, further comprising:
    forming a high-K gate dielectric layer on side and bottom surfaces of the openings; and
    forming a metal gate electrode layer on the high-K gate dielectric layer.

12. The method according to claim 1, wherein:
    the base substrate is a planar semiconductor substrate.

13. The method according to claim 1, wherein:
    the base substrate includes a semiconductor substrate and a plurality of fins protruding from the base substrate;
    the isolation layer is formed in the fins; and
    the dummy gate structures are across the plurality of fins.

14. The method according to claim 10, wherein:
    the interlayer dielectric layer covers the doped source/drain regions after forming the interlayer dielectric layer.

* * * * *